US009368389B2

(12) United States Patent
Hebert

(10) Patent No.: US 9,368,389 B2
(45) Date of Patent: Jun. 14, 2016

(54) SEMICONDUCTOR DEVICE WITH VOIDS WITHIN SILICON-ON-INSULATOR (SOI) STRUCTURE AND METHOD OF FORMING THE SEMICONDUCTOR DEVICE

(71) Applicant: Magnachip Semiconductor, Ltd., Cheongju-si (KR)

(72) Inventor: Francois Hebert, San Mateo, CA (US)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/612,672

(22) Filed: Feb. 3, 2015

(65) Prior Publication Data

US 2015/0348825 A1 Dec. 3, 2015

(30) Foreign Application Priority Data

May 30, 2014 (KR) ........................ 10-2014-0065677

(51) Int. Cl.

*H01L 29/06* (2006.01)
*H01L 21/764* (2006.01)
*H01L 27/12* (2006.01)

(52) U.S. Cl.

CPC .......... *H01L 21/764* (2013.01); *H01L 27/1203* (2013.01); *H01L 29/0649* (2013.01)

(58) Field of Classification Search

CPC .............. H01L 21/764; H01L 29/0649; H01L 27/1203; H01L 21/76264; H01L 21/7682; H01L 29/4991; H01L 2221/1042; H01L 21/76289

USPC .......... 257/288, 368, 369, E21.572, E21.581; 438/151, 197, 199, 319, 421

See application file for complete search history.

(56) References Cited

U.S. PATENT DOCUMENTS 7,691,716 B2 4/2010 Ho et al.
2002/0132448 A1* 9/2002 Lim .................. H01L 21/76264 438/456
2012/0018806 A1 1/2012 Furukawa et al.
2012/0038024 A1 2/2012 Botula et al.
2012/0292700 A1* 11/2012 Khakifirooz ............ H01L 21/84 257/347
2012/0306049 A1* 12/2012 Booth, Jr. ................ H01L 28/92 257/532

* cited by examiner

*Primary Examiner* — Jarrett Stark
*Assistant Examiner* — Shahed Ahmed

(57) ABSTRACT

A semiconductor device with voids within a silicon-on-insulator (SOI) structure and a method of forming the semiconductor device are provided. Voids are formed within a Buried Oxide layer (BOX layer) of the silicon-on-insulator (SOI) semiconductor to enhance a performance index of an RF-SOI switch. The semiconductor device with voids within a silicon-on-insulator (SOI) structure includes a semiconductor substrate; an insulating layer disposed on the substrate; a silicon-on-insulator (SOI) layer disposed on the insulating layer; a device isolation layer and an active area disposed within the SOI layer; one or more voids disposed within the insulating layer; and a sealing insulating sealing an opening of the void.

11 Claims, 7 Drawing Sheets

310
500
430p
430s
400
260c
310
N+
P
N+
N+
P
N+
300
320
200
10
300(SOI)
100
331s
331c
410
331d
250
320
260a
332s
332c
420
332d
320

SEMICONDUCTOR DEVICE WITH VOIDS WITHIN SILICON-ON-INSULATOR (SOI) STRUCTURE AND METHOD OF FORMING THE SEMICONDUCTOR DEVICE

CROSS-REFERENCE TO RELATED APPLICATIONS

This application claims the benefit under 35 U.S.C. §119 (a) of Korean Patent Application No. 10-2014-0065677 filed on May 30, 2014 in the Korean Intellectual Property Office, the entire disclosure of which is incorporated herein by reference for all purposes.

BACKGROUND

1. Field

The following description relates to a semiconductor device with voids within a Silicon-On-Insulator (SOI) structure and a method of forming the semiconductor device. Voids are formed within a Buried Oxide layer (BOX layer) of the Silicon-On-Insulator (SOI) semiconductor and a performance index of a Radio Frequency-Silicon On Insulator (RF-SOI) switch is enhanced.

2. Description of Related Art

To improve a performance of the RF-SOI switch, i.e., a performance index (FOM) defined as (Ron*Coff), the product of a resistance value being on state resistance (Ron) and a capacitance value being an off state (Coff) of a switch device is required to be minimized to minimize a switching loss. A FOM may be minimized without increasing the manufacturing cost.

It has been suggested to use a copper interconnect instead of aluminum to lower a resistance value in an on state (Ron), or to use a material (referred to as a Low-K material) having a dielectric permittivity (or dielectric constant) lower than standard dielectrics (Silicon dioxide for example) to reduce a capacitance in an off state. However, the implementation of such improvements would require additional expensive equipment, which would increase the cost of manufacturing.

Furthermore, if a Trap-Rich layer is added into the SOI semiconductor (typically as an additional layer at the interface of the BOX layer and of the Handle Silicon substrate layer) in order to enhance an RF characteristic, the cost increases by at least 10% or more. Also, as discussed above, a process that adds the Trap-Rich layer requires additional equipment. Therefore, it would be beneficial to realize RF-SOI Switches that have lower FOM and do not require the use of expensive Trap-Rich layers within the SOI semiconductor.

Thus, there is a demand for a method of providing an SOI wafer in which a device performance is increased without a Trap-Rich layer and without the need for expensive Copper metallization or the use of Low-K dielectrics.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An object of the present disclosure is to reduce Parasitic Capacitance under the active area on the SOI semiconductor and by improving the FOM.

Another object of the present disclosure is to reduce capacitance in an off state that is a main parameter for a performance index with respect to a switch device.

In one general aspect there is provided a semiconductor device with voids within a silicon-on-insulator (SOI) structure including a semiconductor substrate, an insulating layer disposed on the substrate, a silicon-on-insulator (SOI) layer disposed on the insulating layer, a device isolation layer and an active area disposed within the SOI layer, one or more voids disposed within the insulating layer, and a sealing insulating sealing an opening of the void.

The semiconductor device may include another insulating layer disposed on a surface of the void.

At least a part of a drain region, a source region, or a channel region of the active area may be formed above an upper region of the void.

A void protection layer may be disposed along sidewalls of the void.

A protection layer may be disposed along sidewalls of the device isolation layer.

A protection layer and another insulating layer may be disposed between the device isolation layer and the void.

The semiconductor device may include at least one of a CMOS (Complementary Metal-Oxide Semiconductor), an NMOS (N-type Metal-Oxide Semiconductor), a PMOS (P-type Metal-Oxide Semiconductor), an LDMOS (Laterally Diffused Metal-Oxide Semiconductor), a BJT (Bipolar Junction Transistor), a Diode, a Schottky diode, GaAs, InP, and GaN-based devices such as MESFETs, HEMTs, pHEMTs, MIS-HEMTs, or MOSFETs.

The void may be filled with pure nitrogen or be under vacuum.

A length of the void is longer than the length of the opening.

In another general aspect there is provided a method of forming a semiconductor device with voids within a silicon-on-insulator (SOI) structure, the method including patterning on a silicon-on-insulator (SOI) substrate comprising an insulating layer between a substrate and an SOI layer, forming a gap region by selectively etching the SOI layer and exposing the insulating layer, etching the exposed insulating layer to form voids within the insulating layer, and sealing the void.

The voids may extend laterally from the gap region formed in the SOI layer.

The void may be sealed by a thermal oxidation method or a chemical vapor deposition (CVD) method.

The sealing of the void may include filing the gap region with another insulating layer.

The method may include forming a device isolation layer on the SOI layer prior to the patterning on the SOI substrate.

The forming of the device isolation layer may include forming at least one trenches in the SOI layer through a mask process, forming an anti-etching, protection or barrier, layer at sides of the at least one trench, and filing the at least one trench with an insulating layer.

The method may include forming a void-protection layer on a surface of the void.

The method may include forming a device isolation layer on the SOI layer after the sealing of the void.

Other features and aspects will be apparent from the following detailed description, the drawings, and the claims.

Figure 1:
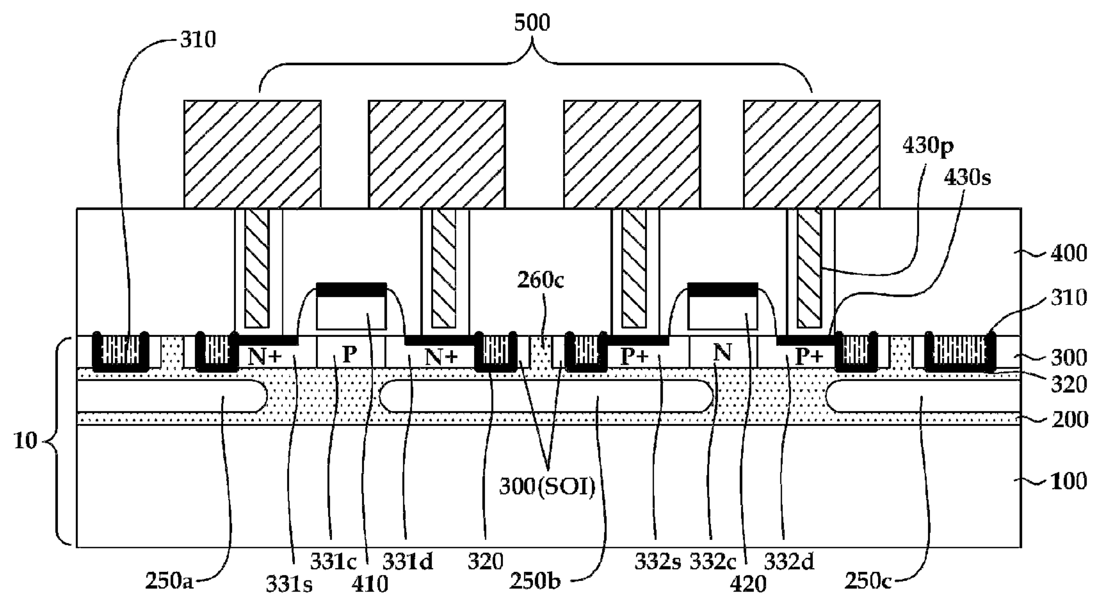
FIG. 1 is a diagram illustrating an example of a semiconductor device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

FIG. 1 is a diagram illustrating an example of a semiconductor device. As illustrated in the example of FIG. 1, a semiconductor device is situated in a silicon-on-insulator (SOI) wafer 10 or a silicon-on-insulator (SOI) substrate 10 consisting of a semiconductor substrate 100 (also referred to as a handle wafer), an insulating layer 200 (a BOX layer), and a semiconductor layer 300 (or an SOI layer). An insulating layer is formed between silicon single crystal layer and a surface region used as a semiconductor device so that influence of an additional silicon layer acting as a foundation could be discrete. Thereby, the SOI wafer 10 allows for high speed as well as low power consumption.

Referring to FIG. 1, a CMOS (Complementary metal-oxide-semiconductor) device is formed in the SOI layer 300. However, this illustration is not intended to limit the present examples and various semiconductor devices, which may be formed in the SOI layer 300, are considered to be well within the scope of the present disclosure. The devices formed in the SOI layer 300 may comprise any one or more selected from devices, such as, for example, an NMOS (N-type metal-oxide-semiconductor), a PMOS (P-type metal-oxide-semiconductor), an LDMOS (laterally diffused metal-oxide-semiconductor), a BJT (bipolar junction transistor), a Diode, a Schottky diode.

One or more device isolation layers are formed in the above SOI layer 300, thereby making it possible for each device formed into the SOI layer to be driven separated.

In one non-exhaustive example, a Shallow Trench Isolation (STI) 310 may be the device isolation layer. The STI is formed by filing an inside of a trench with an insulating layer after forming the trench in a semiconductor substrate.

In another non-exhaustive example, a local oxidation of silicon (LOCOS) oxide layer may be the device isolation layer. The LOCOS oxide layer is formed through a LOCOS process to selectively grow an oxide layer on a substrate of a semiconductor and to thereby form a device isolation layer.

FIG. 1 illustrates an example where the shallow trench isolation (STI) 310 is used as the device isolation layer. However, other device isolation layer such as, for example, local oxidation of silicon (LOCOS) oxide layer, may be used instead of the STI without departing from the spirit and scope of the illustrative examples described.

One or a plurality of voids 250 are formed within an insulating layer 200 disposed under the SOI layer 300. Here, the void 250 means an empty spatial region and may be indicated as a hole, a void, or the like in some examples.

The void 250 is an empty space and may be filled with air, pure nitrogen, or be under vacuum. The capacitance of air corresponds generally to about ¼ of the capacitance value of the insulating layer 200, since the dielectric constant is ~1. Therefore, by forming a void 250 into a region of the insulating layer 200, the off state capacitance value of the Figure of Merit, i.e., a performance index (FOM) is lowered.

Moreover, the void 250 is situated under the active areas 331 and 332 formed within the SOI layer 300, so that the formation of inversion layer is reduced. For this reason, an RF performance as well as device isolation can be enhanced.

An interlayer insulating layer 400 for an operation of the devices is formed within the SOI layer 300. In addition, a conductive plug 430*p* and a metal wiring 500 connected to the above devices are formed. By way of example, a plug (TiN+W Plug) composed of a nitrided titanium barrier and a tungsten conductive fill, may be applied as a plug 430*p*.

Figure 2:
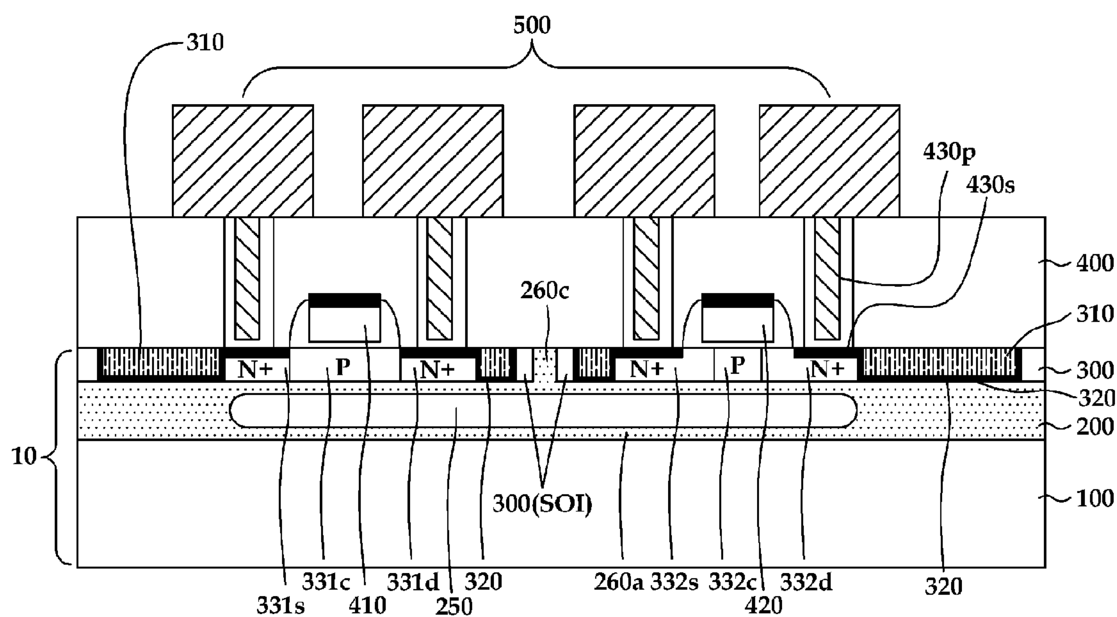
FIG. 2 is a diagram illustrating another example of a semiconductor device.

As illustrated in FIGS. 1 and 2, the semiconductor device may be configured to employ voids 250 formed within the insulating layer 200 of the SOI wafer. As illustrated in FIG. 1, void 250*b* is formed under a region including a drain region 331*d* of a first active device and under a source region 332*s* of a second active device that is close to the first active device. As illustrated in FIG. 2, voids 250 may be situated to overlap the bottom regions of the active areas 331 and 332 that include the source region 332*s* and the drain region 331*d* as well as the channel regions 331*c* and 332*c* concerning two active devices of FIG. 2. At an upper portion of the void 250, at least one or more regions of a drain region, a source region, and a channel region of an active area or device 331 and 332 may be formed. It can be appreciated that the above void region 250 is extended to a portion of the insulating layer 200 disposed under the active area that includes one or more selected from a drain region, a source region and a channel region. The said void 250 may also be formed under the device isolation layer 310.

Referring to FIG. 1, an example is provided in which voids 250 are formed under a source region and a drain region of an active device. Based on a distance between each active device or a width of an etching process, The void 250 may be extended or expanded to the insulating layer 200 disposed under a source region or a drain region of a certain active device.

In a non-exhaustive example, the void 250 under a portion of the active region, i.e., at a bottom region of the channel region of an active device. One skilled in the art will appreciate that this structure may also be realized in a modified form without departing from the spirit and scope of the illustrative examples described to have a standard distance between each active device, width selected based on the lateral extension of an etching process used to form the void(s).

Figure 3:
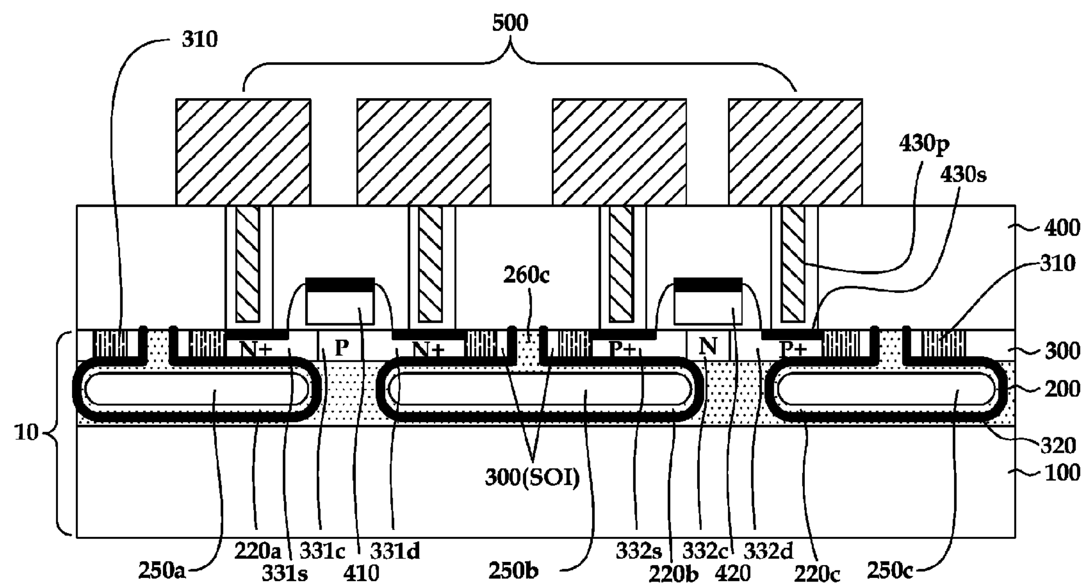
FIG. 3 is a diagram illustrating a magnified example of either FIG. 1 or FIG. 2.

The example illustrated in FIG. is similar to FIGS. 1 and 2 in that a void 250 is situated under an active area of a silicon-on-insulator (SOI) substrate 10. In FIG. 3, a void protection layer 320 surrounding a void 250. The void protection layer 320 is formed at sidewalls of the void 250 and surrounds a portion of the void 250. The void protection layer 320 restrains the void 250 from being etched during forming the shallow trench isolation (STI) region 310. The void protection layer 320 is referred to as an anti-etching (or protection) layer and a silicon nitride layer may be used.

Referring to FIGS. 1 and 2, a protection layer similar to the void protection layer 320 exists at the shallow trench isolation (STI) region 310. The protection layer is situated at sidewalls of the STI. Silicon nitride layer may be used for the protection layer. If a silicon nitride layer is situated to cover the sidewalls of the STI region 310, a part of an insulating layer filled into the shallow trench isolation (STI) region, is restrained from being etched from the subsequent formation process of the voids (an etching process using an etching solution, etc.).

Figure 4:
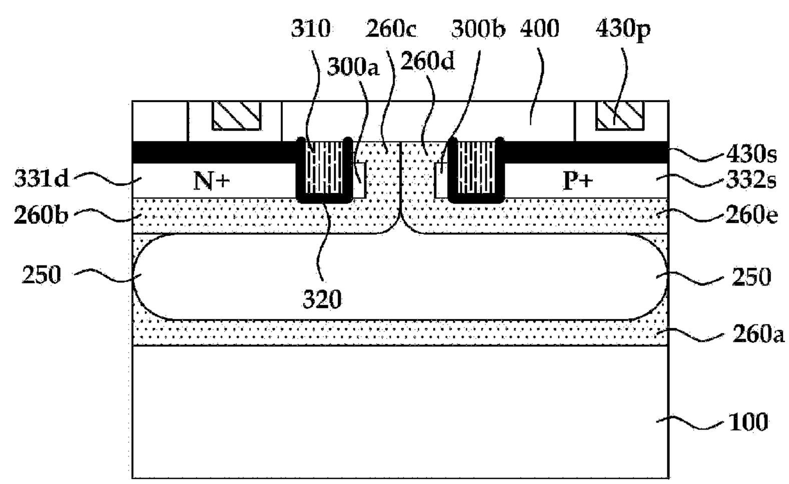
FIG. 4 is a diagram illustrating another example of a semiconductor device.

FIG. 4 is a diagram illustrating an example in which a structure near the void 250 of FIG. 1 or 2 is magnified. To form a void 250, an empty space is formed within the insulating layer 200 by means of an isotropic etching process. By etching a part of asilicon-on-insulator (SOI), an insulating layer 200 is exposed, and by pouring an etching solution or using plasma etching techniques to the exposed part and removing an insulating layer, an empty space is so formed. Accordingly, a gap region having a partially open bottle-neck shape is formed at the upper part, a void 250 horizontally longer than the gap region is formed at the bottom part. When performing a deposition process with respect to an insulating layer or an oxide layer, the gap is filled with the insulating layer due to a small width of the gap region and the gap is closed. As a result, a void 250 where an upper portion is filled first is attained as illustrated in the example of FIG. 4.

By means of the process explained above, a first insulating layer 260*c* and a second insulating layer 260*d* are formed to fill the gap region between the first SOI layer 300*a* and the second SOI layer 300*b*. Since the first insulating layer 260*c* and the second insulating layer 260*d* bury the gap region, they are referred to as a buried insulating layer. Further, a third insulating layer 260*b* and 260*e* exist between the void 250 and the SOI layer 300. A fourth insulating layer 260*a* also exists under the void 250. The first, second, third, fourth insulating layers are the same material as an insulating layer deposited during filling the void 250.

Between the first insulating layer 260*c* and the second insulating layer 260*d*, an interface is potentially generated. An insulating layer grown at both sides meets at a center part to form an insulating layer by means of a chemical vapor deposition (CVD) method. However, the first insulating layer 260*c* and the second insulating layer 260*d* are the same insulating layers, thus the interface is potentially not shown. As a result, a device isolation layer such as shallow trench isolation (STI) 310 or the like is isolated by a certain interval, for formation of a void 250 within an insulating layer 200. The insulating layers 260*c* and 260*d* formed between two shallow trench isolations (STI) 310 are guided to fill the exposed portion (gap region) of the void 250. The said insulating layers 260*c* and 260*d* act to seal an opening (exposed portion) of the void.

Further, between a bottom surface of the device insulating layer 310 and the void region 250, two layers comprising a protection layer 320 and a third insulating layer 260*b* and 260*e* are disposed. Also, between a base substrate 100 as a handle wafer, and a void 250, a fourth insulating layer 260*a* is disposed. The insulating layers 260*a*, 260*b* and 260*c*, and 260*d* and 260*e* configured as above, are required not only for a protection of the void region 250 but for isolation from other device regions.

The void 250 discussed above may be formed prior to the forming of the STI 310, or after the forming of the STI 310 as an example of a device isolation layer. The manufacturing process differs and the difference is explained with reference to FIG. 5A and so forth.

Figure 5A:
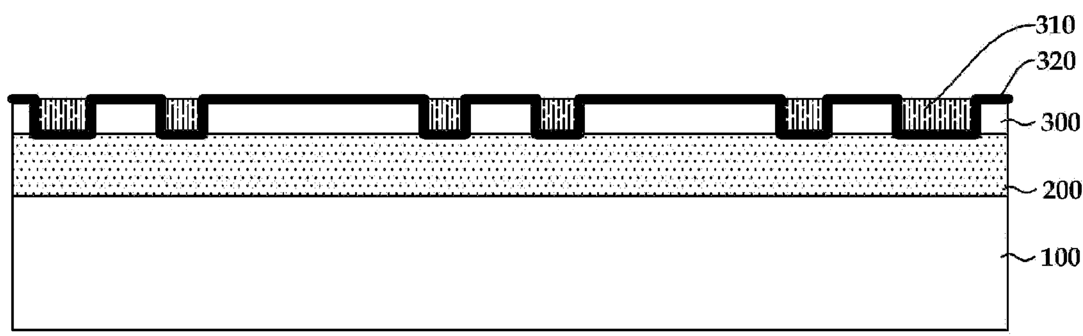
FIGS. 5A, 5B, 5C, and 5D are diagrams illustrating examples of a method of forming a semiconductor device.

Hereinafter, a method of forming a semiconductor device is described with reference to FIGS. 5A to 5D and 6A to 6D As illustrated in the example of FIG. 5A, a silicon-on-insulator (SOI) wafer is prepared. The SOI wafer may be configured in the order of a substrate 100, an insulating layer 200, and an SOI layer 300. The substrate 100 is a structure referred to as a main silicon substrate or a handle wafer. However, these are only examples and various silicon substrates can be used without departing from the spirit and scope of the illustrative examples described.

The insulating layer 200 is an oxide layer disposed at the upper portion of the substrate 100. The layer is a structure configured to electrically insulate the substrate 100 from the SOI layer 300 and is referred to as a Buried Oxide Layer (BOX layer).

The SOI layer 300 is a silicon layer disposed at the upper portion of the insulating layer 200 and is referred to as a silicon-active layer or a device layer.

A trench (not illustrated) is formed to form a shallow trench isolation (STI) region 310 in the SOI layer 300. A silicon oxide layer (not illustrated) and an anti-etching layer 320 are formed at the sides and the bottom surface of the trench. A silicon nitride layer or a silicon oxide nitride layer (SiON) may be used for the anti-etching layer.

A shallow trench isolation (STI) region is formed in an SOI layer 300 by means of a mask process or an etching process to form the trench. An anti-etching or protection layer 320 is formed to surround the surface of the SOI layer 300 and the sides and the bottom surface of the STI region. An STI 310 is formed by means of an oxidation deposition process. Additionally, it is possible that an oxide layer applied on an SOI wafer is polished flat using a chemical application and a physical application by means of a CMP (Chemical Mechanical Polishing) process. During the CMP process, the anti-etching layer 320 formed on a surface of the SOI layer 300 may be used as a CMP stop layer.

Figure 5B:
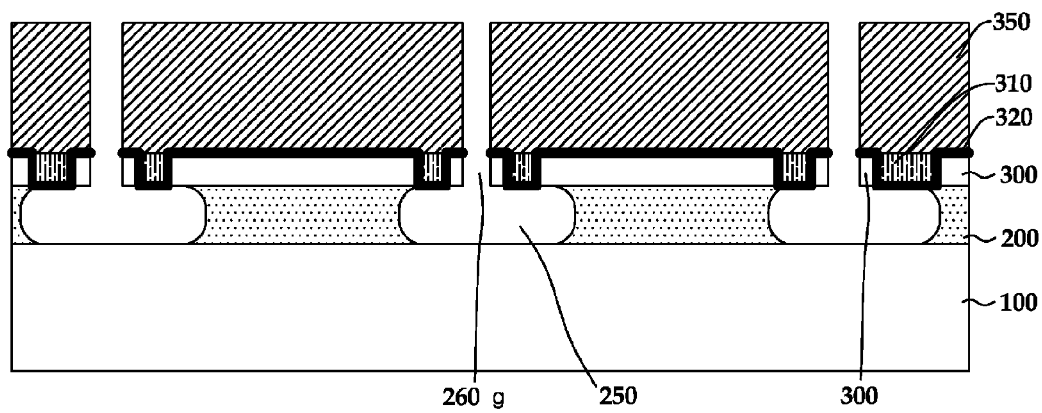

As illustrated in the example of FIG. 5B, the top of the SOI layer 300 and the STI region 310 is subject to the patterning using masking layer 350. By selectively performing a dry etching to a part of the SOI layer 300, an insulating layer 200 is exposed. By means of the etching process, a gap region 260*g* is formed through the SOI layer 300. The gap region 260*g* may be formed by means of an anisotropic etching method. Subsequently, a patterning mask 350 may be eliminated. However, the patterning mask 350 may be eliminated after forming voids 250. For ease of explanation, the patterning mask 350 is proposed in conjunction with a configuration that forms voids 250 and deletes then for illustrative purposes, but the present example is not restricted thereto.

After forming the gap region 260*g*, a wet etching is performed in order for a void to be contained within an insulating layer 200, i.e., the Buried Oxide layer (BOX layer). A substrate 100 may be exposed depending on a degree of the wet etching. By means of such isotropic etching process, a void 250 is formed inside an insulating layer 200 of the SOI wafer. The wet etching is an isotropic etching, thus, a circular or oval void is formed which extends away from opening 260*g*. If the circular or oval void 250 is formed in the insulating layer 200 (BOX layer), a stress applied to the silicon layer 300 (SOI layer) is beneficially less than in a situation where another different shape void is formed. After the isotropic etching described above, the remaining patterning mask 350 is removed.

The void 250 formed by the above etching process may be aligned to contact the bottom surface of the STI 310, depending on an etched degree. The pre-formed STI 310 may be damaged due to the above-described etching process. The damage may occurs with respect to a part of the pre-formed STI 310 due to the etching process for formation of the void 250.

To prevent this damage, an anti-etching layer 320 or a protection layer 320 are formed in advance, at the inside walls of the device isolation layer such as the STI 310 or LOCOS oxide layer. If the anti-etching layer 320 is formed at the bottom surface of the STI 310 as discussed above, damage to the bottom surface of the STI 310 is alleviated by means of the anti-etching layer 320, even in a situation in which an etching solution comes in contact with a bottom surface of the STI 310 during the etching process for formation of the void 250.

A nitride liner may be applied as the anti-etching layer 320. All kinds of materials that can prevent surrounding materials from the damage due to the other etching processes may also be used, without departing from the spirit and scope of the illustrative examples described.

A Various sizes and form of voids 250 in the example illustrated in FIG. 5B are possibly, without departing from the spirit and scope of the illustrative examples described. For example, unlike in the example illustrated in FIG. 5B, the void 250 may be situated to include only bottom regions of any one of a source region and a drain region of the active device formed within the SOI layer 300. Or, the void 250 may be situated to include only bottom regions of a part of a region, rather than the entire region of the active device formed within the SOI layer 300.

Hereinafter, in the example of FIG. 5C, the voids 250 are formed at a bottom region comprising a source region and a drain region of an active device formed within the SOI layer 300. However, this illustration is not intended to limit the present examples.

Figure 5C:
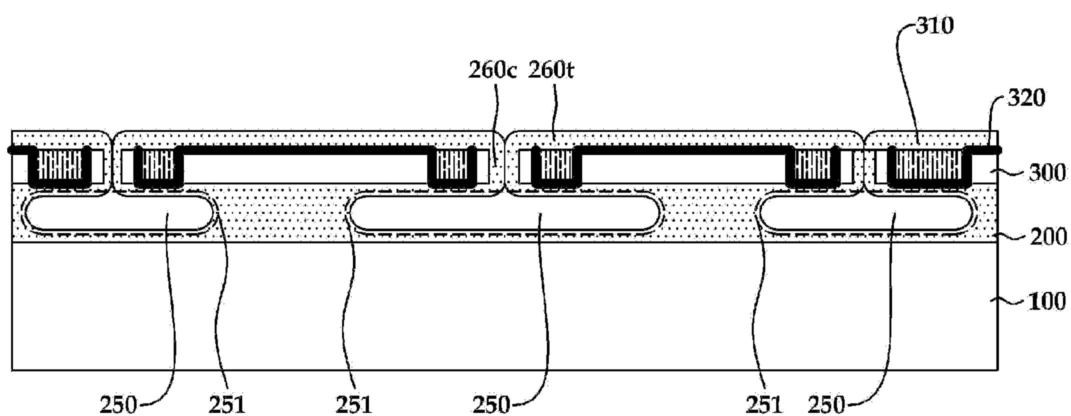

FIG. 5C illustrates the sealing of the void 250. To seal the void 250, an insulating layer deposition process is performed. An insulating layer deposition process using a thermal oxidation method or a chemical vapor deposition (CVD) method or a combination of thermal and deposited dielectric and semiconductor materials may be used as a sealing method.

For an insulating layer deposition process, a thin oxide layer may be formed at a surface of the void using a thermal oxidation. In thermal oxidation, a thin oxide layer may be formed at an upper portion of the SOI layer 300. A width of the gap region formed into the SOI layer 300 is filled with the oxide layer.

A gap region having a wide width is difficult to be filled entirely by means of a thermal oxidation method. Therefore, an insulating layer by an additional deposition may be used or the gap region may be filled by means of a CVD method. The CVD method enables an opening of the void 250 to be sealed because a conformal insulating layer is deposited. Due to a narrow gap region 260*g*, a CVD insulating layer 260*c* and 260*t* are first used for the filing. At the same time, an insulating layer 260*c* and 260*t* may be formed at the upper portion of the void. The insulating layers 260*c* and 260*t* are deposited at the same time. on the left and right of the gap region 260*g*. The insulating layers 260*c* and 260*t* may be formed in the region inside of the void. A thickness of the insulating layer formed at the gap region is the thickest. An insulating layer formed inside the void 250 has a smallest thickness because an amount of gas deposited to an inside surface of the void 250 is relatively small. Thus, the insulating layer 260*c* and 260*t* are formed between the void 250 and the SOI layer 300. A silicon oxide layer, a silicon nitride layer, a silicon oxide nitride layer are possibly applied with regards to the CVD insulating layer.

Through an optional annealing process, impurities such as, for example, carbon, hydrogen, moisture included inside the insulating layer deposited by means of the CVD method is removed. Also, through the annealing, a CVD insulating layer is changed into an insulating layer having an excellent characteristic such as a thermal oxide.

Through a planarization process (CMP process), an insulating layer 260*c* and 260*t* formed on a wafer surface is removed.

Figure 5D:
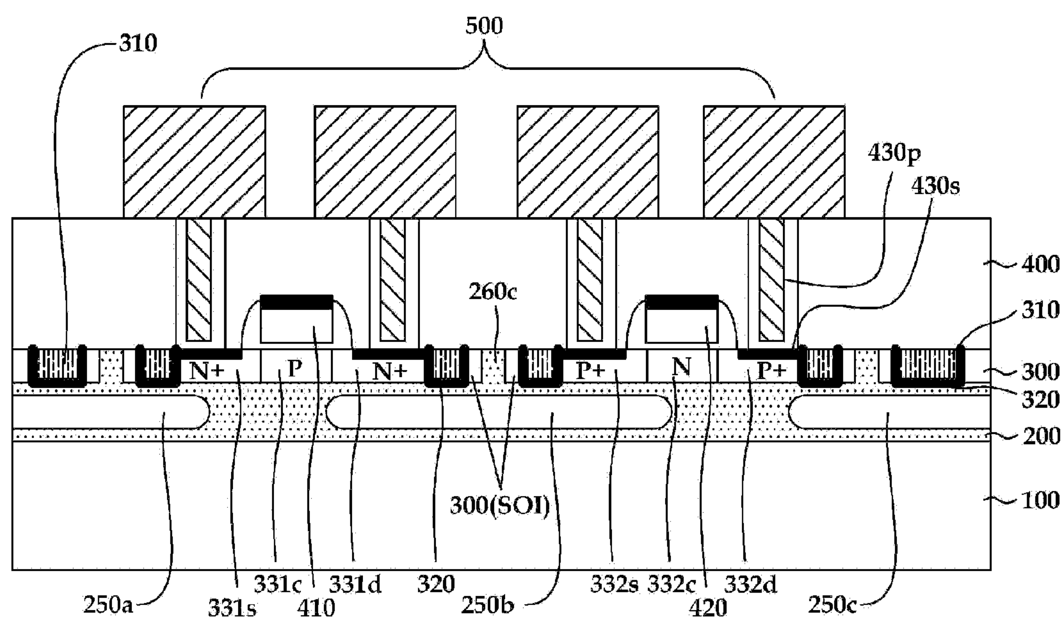

As illustrated in the example of FIG. 5D, a passive or active device is situated in the SOI layer 300. By way of example, gate electrodes 410 and 420 and source/drain regions 331 and 332 are formed. A silicide 430*s* is situated with respect to the source/drain regions and gate electrode, to reduce the resistance of silicon contacts. In the example illustrated in FIG. 5D, a CMOS (Complementary metal-oxide-semiconductor) is formed in the SOI layer 300, however, other type of devices are considered to be well within the scope of the present disclosure. For examples, any one or more device selected from an NMOS (N-type metal-oxide-semiconductor), a PMOS (P-type metal-oxide-semiconductor), an LDMOS (Laterally Diffused metal-oxide-semiconductor), a BJT (Bipolar Junction Transistor), a Diode, a Schottky Diode, GaAs, InP, and GaN-based devices such as MESFETs, HEMTs, pHEMTs, MIS-HEMTs, MOSFETs may be formed in the SOI layer 300.

An interlayer insulating layer 400 is formed to insulate a device formed in the SOI layer 300. A plug 430*p* and a metal wiring 500 connected with the electrodes of the devices may be formed. A plug (TiN+W Plug) composed of a nitrided titanium and a tungsten may be applied as a plug 430*p*.

In the examples of FIGS. 5A to 5D, prior to the forming of the void 250 within the insulating layer 200, an anti-etching layer 320 is formed at the sides and the bottom surface of the shallow trench isolation (STI) 310 during the forming of the STI 310 in the SOI layer 300. Hence, the damage of the STI 310, which is already formed during the formation of the void 250, is prevented. In that case, the voids may formed extending laterally from the gap region formed in the SOI layer.

In other examples, as shown in FIGS. 6A to 6D, the void 250 within the insulating layer 200 is formed prior to the forming of the STI 310 in the SOI layer 300.

Figure 6A:
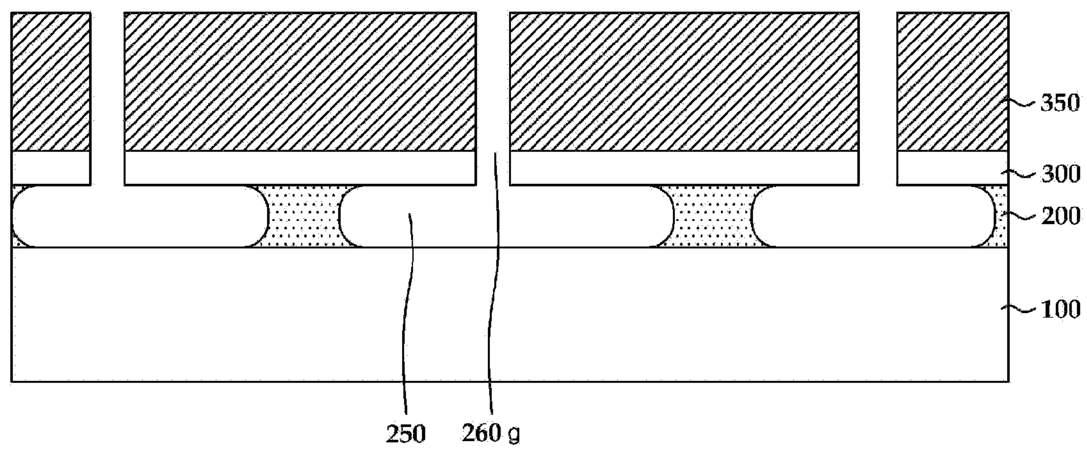
FIGS. 6A, 6B, 6C, and 6D are diagrams illustrating examples of a method of forming a semiconductor device.

As illustrated in the example of FIG. 6A, by performing an etching process configured to use an additional mask 350 with respect to the prepared SOI wafer, a void 250 may be formed within the insulating layer 200 prior to the STI 310 of the SOI layer 300.

Figure 6B:
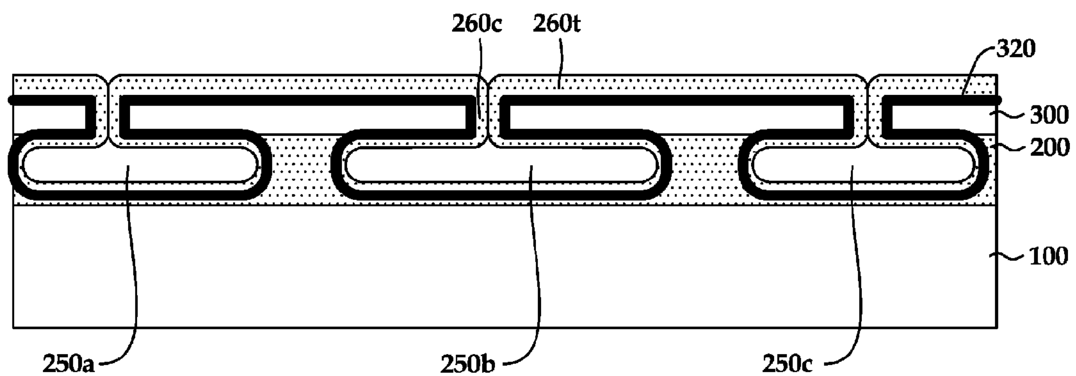

As illustrated in the example of FIG. 6B, a part of the SOI layer 300 is selectively dry etched so that the insulating layer 200 may be exposed. A gap region 260*g* is formed in the SOI layer 300 through the etching process. The gap region 260*a* may also be formed by an anisotropic etching method. After forming the gap region 260*g*, a wet etching is performed to form voids within an insulating layer 200, i.e., a Buried Oxide layer (BOX layer). A substrate 100 may be exposed depending on a degree of the wet etching. A void 250 is formed in an insulating layer 200 of the SOI wafer through the etching process. The wet etching is an isotropic etching, thus, a circular or oval void is formed. A size and a position of voids 250 formed by the etching process may be varied. In a non-exhaustive example, a void 250 is formed under the source region or drain region of a device formed into the SOI layer 300. Unlike the example illustrated in FIG. 6A, in another non-exhaustive example, a void 250 formed by an etching process may have a height smaller than a height of the insulating layer. A dry etching or a wet etching is optionally applied with regards to the etching process.

As illustrated in the example of FIG. 6B, an anti-etching layer 320 surrounding a void 250 exposed through an etching process and an SOI layer 300 is provided. The opening of the exposed void 250 is filled with the insulating layer 260*c* and 260*t*.

An anti-etching layer 320 is formed to surround the void 250 and the SOI layer 300 exposed through the etching process. Through an oxide layer deposition process, the exposed void 250 is filled with the oxide layer to form voids 250. Depending on the method of forming the semiconductor device discussed herein, a CMP process is optionally added to polish an insulating layer formed on the surface of the SOI wafer.

Figure 6C:
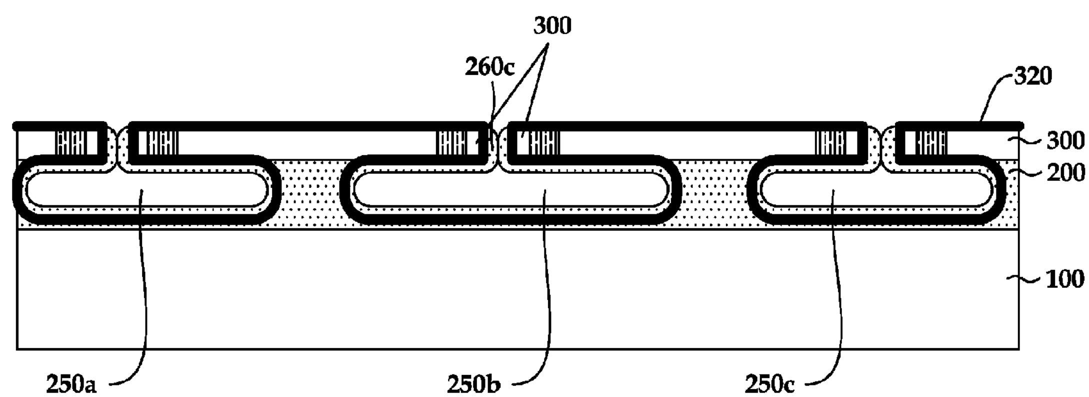

As illustrated in the example of FIG. 6C, an additional mask process and etching process may be used to form an STI 310 in the SOI layer 300. To form an STI 310 in an SOI layer 300, a trench is formed in a region in which the STI 310 is to be formed. The trench may be provided by a mask and an etching process to facilitate the formation of the STI 310. While implementing an etching process to form a trench, the void 250 already formed through the etching process may be potentially damaged if the void 250 is disposed under the region in which the trench is formed. Damage may occur to an outer portion of the void 250 already formed by the etching process.

The present example prevents damage to a void 250 due to the etching process by forming an anti-etching or protection layer 320 to surround a surface of the void 250 and the SOI layer 300 after the formation of the void 250. By forming the anti-etching layer 320 at the outer portion of the pre-formed void 250, it is possible to prevent the void 250 from the damage due to the etching process for formation of the trench. An example of the anti-etching layer 320 may be a silicon nitride liner.

By forming an insulating layer such as an oxide layer, within the formed trench, a shallow trench isolation (STI) 310 is formed in an SOI layer 300.

Figure 6D:
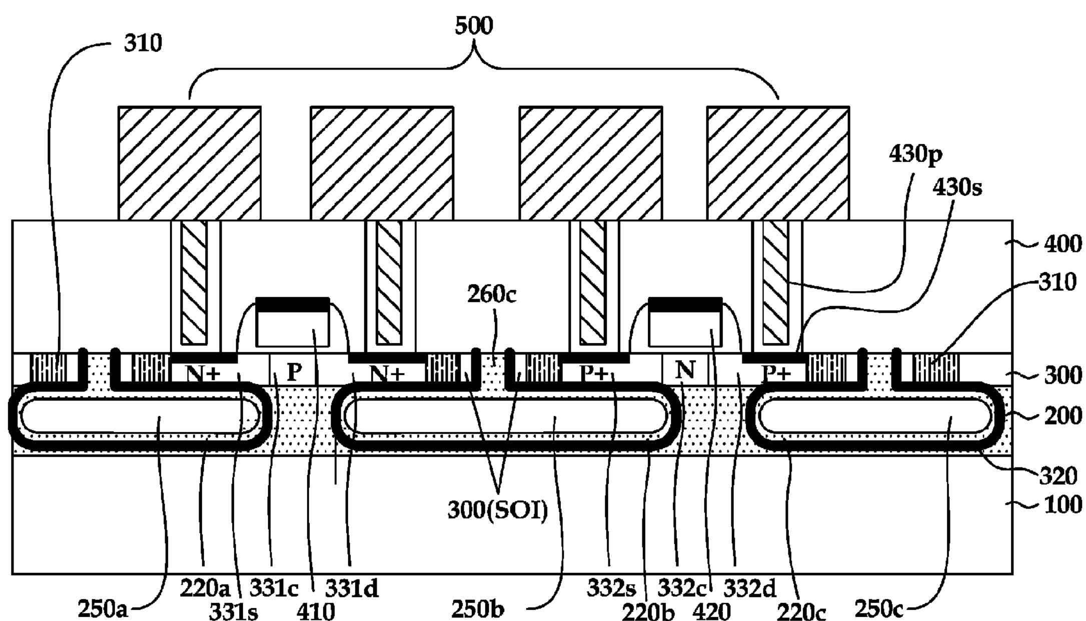

As illustrated in the example of FIG. 6D, various devices are formed within the SOI layer 300. This example is discussed above with reference to FIG. 5D and, and thus will not be repeated here.

In the discussion with regards to FIGS. 5A to 6D, an example is provided in which a void 250 formed in the insulating layer 200 of the SOI wafer includes only a bottom of the source/drain regions of the active device formed in the SOI layer 300.

The discussed examples are intended only to explain the structure suggested herein more easily. Therefore, in other examples a size, a shape and other features of the void 250 may be different than the examples above, without departing from the spirit and scope of the illustrative examples described.

In the present examples, a semiconductor device with voids within a silicon-on-insulator (SOI) structure and a method of forming the semiconductor device are such that it is possible to lower an off state capacitance value by forming voids within an insulating layer (a BOX layer) beneath the SOI layer of the SOI wafer and to enhance and improve the performance of the switch. The capacitance value is reduced by about one-fourth ¼ in comparison with the prior art.

By forming a void in the oxide layer, parasitic capacitance formed at a bottom of an active area of the device is reduced.

The inversion layer formation under the device region is reduced in respect of the void being formed under the active area formed with the SOI layer based. Thus, a device isolation is enhanced and improved, further an RF performance is improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device with voids within a silicon-on-insulator (SOI) structure comprising:
- a semiconductor substrate;
- an insulating layer disposed on the substrate;
- a silicon-on-insulator (SOI) layer disposed on the insulating layer;
- a device isolation layer and an active area disposed within the SOI layer;
- a void disposed within the insulating layer; and
- a sealing insulating layer or film sealing an opening of the void.

2. The semiconductor device of claim 1, further comprising another insulating layer disposed on a surface of the void.

3. The semiconductor device of claim 2, wherein at least a part of a drain region, a source region, or a channel region of the active area is formed above an upper region of the void.

4. The semiconductor device of claim 1, further comprising a void protection layer disposed along sidewalls of the void.

5. The semiconductor device of claim 1, further comprising a protection layer disposed along sidewalls of the device isolation layer.

6. The semiconductor device of claim 1, comprising a protection layer and another insulating layer disposed between the device isolation layer and the void.

7. The semiconductor device of claim 1, wherein the semiconductor device comprises at least one of a CMOS(Complementary Metal-Oxide Semiconductor), an NMOS(N-type Metal-Oxide Semiconductor), a PMOS(P-type Metal-Oxide Semiconductor), an LDMOS(Laterally Diffused Metal-Oxide Semiconductor), a BJT(Bipolar Junction Transistor), a Diode, a Schottky diode, GaAs, InP, and GaN-based devices such as MESFETs, HEMTs, pHEMTs, MIS-HEMTs, or MOSFETs.

8. The semiconductor device of claim 1, wherein the void is filled with pure nitrogen or under vacuum.

9. The semiconductor device of claim 1, wherein a length of the void is longer than a length of the opening.

10. The semiconductor device of claim 1, wherein the void has a horizontal type shape or alignment parallel to a top surface of the substrate.

11. The semiconductor device of claim 1, wherein the void has a larger width in a horizontal direction than a vertical height of the insulating layer.

* * * * *